US010083759B2

(12) United States Patent
Nakamura (10) Patent No.: US 10,083,759 B2
(45) Date of Patent: Sep. 25, 2018

(54) TESTING CIRCUIT FOR SEMICONDUCTOR INTEGRATED CIRCUIT AND TESTING METHOD USING THE SAME

(71) Applicant: MegaChips Corporation, Osaka (JP)

(72) Inventor: Hiroyuki Nakamura, Chiba (JP)

(73) Assignee: MegaChips Corporation, Osaka (JP)

( * ) Notice: Subject to any disclaimer, the term of this patent is extended or adjusted under 35 U.S.C. 154(b) by 126 days.

(21) Appl. No.: 15/073,979

(22) Filed: Mar. 18, 2016

(65) Prior Publication Data

US 2016/0282409 A1 Sep. 29, 2016

(30) Foreign Application Priority Data

Mar. 27, 2015 (JP) .................................. 2015-065953

(51) Int. Cl.
| | |
|---|---|
| *G01R 31/30* | (2006.01) |
| *G11C 29/02* | (2006.01) |
| *G01R 31/317* | (2006.01) |
| *G11C 29/04* | (2006.01) |

(52) U.S. Cl.
CPC ...... *G11C 29/023* (2013.01); *G01R 31/31725* (2013.01); *G11C 2029/0401* (2013.01)

(58) Field of Classification Search
CPC ..... G02B 6/2861; G02B 7/40; G02F 2201/20; G06G 7/625; G10H 2250/041; G10H 2250/051; G10H 2250/115; G10H 2250/521; G10K 15/12; H03H 9/133; C23C 16/505; G01L 1/14; G05B 2219/37277; G05B 2219/37289; G06K 7/08; G04F 10/00; G04F 8/00

USPC ............ 324/76.35, 76.54, 613–627; 368/113
See application file for complete search history.

(56) References Cited

U.S. PATENT DOCUMENTS

| | | | | |
|---|---|---|---|---|
| 5,543,859 A | * | 8/1996 | Miyata | H04N 5/208 348/625 |
| 6,470,485 B1 | * | 10/2002 | Cote | G01R 31/318519 324/613 |
| 2010/0027359 A1 | * | 2/2010 | Banno | G11C 29/022 365/201 |
| 2011/0242914 A1 | * | 10/2011 | Ito | G06F 1/10 365/194 |
| 2012/0198294 A1 | * | 8/2012 | Nadeau-Dostie | G11C 29/50012 714/719 |

FOREIGN PATENT DOCUMENTS

JP      2010/197149 A     9/2010

* cited by examiner

*Primary Examiner* — Tung X Nguyen
*Assistant Examiner* — Robert P Alejnikov, Jr.
(74) *Attorney, Agent, or Firm* — Osha Liang LLP (57) ABSTRACT

A testing circuit is arranged in a semiconductor integrated circuit so as to detect a delay fault in the semiconductor integrated circuit. The semiconductor integrated circuit includes a first output control circuit having a plurality of sequential circuits, a first combination circuit connected to the first output control circuit, and a memory circuit connected to the first combination circuit. The testing circuit includes the first output control circuit; a second output control circuit; and a third output control circuit. The testing circuit, under control of a testing apparatus connected to the semiconductor integrated circuit, is configured to perform steps to detect the delay fault in the semiconductor integrated circuit.

12 Claims, 7 Drawing Sheets

TESTING CIRCUIT FOR SEMICONDUCTOR INTEGRATED CIRCUIT AND TESTING METHOD USING THE SAME

FIELD OF THE INVENTION

The present invention relates to a testing circuit for a semiconductor integrated circuit and a testing method using the same, and particularly relates to a testing circuit for detecting a delay fault in a semiconductor integrated circuit and a testing method using the same.

BACKGROUND OF THE INVENTION

Semiconductor integrated circuits typically include a memory circuit including a storage element such as a ROM, a flash memory, an SRAM or a DRAM, and a logic circuit including sequential circuits such as flip-flops and combination circuits. For maintenance and enhancement of the product quality of such semiconductor integrated circuits, it is important to detect an irregular delay in the logic circuit or the memory circuit as a delay fault. For example, for a test for detecting a delay fault in the logic circuit, a scan test is known, and, for a test for detecting a delay fault in the memory circuit, a memory BIST (built-in self-test) is known.

In a scan test, a scan path, which is provided in advance in a logic circuit of a semiconductor integrated circuit, is used. In other words, in a scan test, a testing apparatus sets sequential circuits in an output control circuit to a predetermined state via the scan path. The predetermined state is set so that upon a state of sequential circuits disposed so as to precede a combination circuit is transmitted to sequential circuits disposed so as to follow the combination circuit, the state of the following sequential circuits transitions. The testing apparatus sets the sequential circuits to the predetermined state and then makes the combination circuit operate at a frequency of actual operation, transmits the state of the sequential circuits disposed so as to precede the combination circuit to the sequential circuits disposed so as to following the combination circuit via the combination circuit, and further extracts the state of the following sequential circuits via the scan path, and determines whether or not the extracted state of the sequential circuits corresponds to a predetermined expected value, whereby the testing apparatus detects a delay fault in the logic circuit.

On the other hand, in a memory BIST, a dedicated circuit, which is provided in advance in a semiconductor integrated circuit, is used. In other words, in a memory BIST, a testing apparatus writes test data into a memory circuit at an actual operation speed using the dedicated circuit, and then reads the written test data and determines whether or not the read test data corresponds to a predetermined expected value, thereby detecting a delay fault in the memory circuit.

However, in a test specialized for delay fault detection in either a logic circuit or a memory circuit such as stated above, no delay fault in a path from the logic circuit to the memory circuit and a path from the memory circuit to the logic circuit can be detected. In other words, although in order to detect a delay fault in the path from the logic circuit to the memory circuit or the path from the memory circuit to the logic circuit, it is necessary to make these circuits operate simultaneously during a test, the test is designed so as to make only a specific one of the circuits operate, no consideration of making two circuits operate simultaneously has been made.

Therefore, for example, as disclosed in Japanese Patent Laid-Open No. 2010-197149, a semiconductor apparatus for detecting a delay fault in a path from a logic circuit to a memory circuit has been proposed. In other words, in the semiconductor apparatus disclosed in Japanese Patent Laid-Open No, 2010-197149, an output from an input-side test-specific logical circuit disposed so as to precede a memory macro is temporarily loaded into a scan flip-flop and an output from the scan flip-flop is output to the memory macro, enabling detection of a delay fault in a path from the scan flip-flop to the memory macro.

However, as described above, in the semiconductor apparatus disclosed in Japanese Patent Laid-Open No. 2010-197149, an output of the input-side test-specific logical circuit preceding the memory macro is temporarily loaded into the scan flip-flop and the loaded data is output from the scan flip-flop to the memory macro, and thus no delay fault in a path from a downstream-most combination circuit in an input-side user logic circuit preceding the memory macro to the memory macro still can be detected, which is insufficient for delay fault detection in a part of connection between a logic circuit and a memory circuit in a semiconductor integrated circuit.

Therefore, an object of the present invention is to provide a testing circuit enabling delay fault detection in a path from a downstream-most combination circuit in a preceding logic circuit to a memory circuit and a path from the memory circuit to a following combination circuit in a semiconductor integrated circuit.

SUMMARY OF THE INVENTION

In order to achieve the above object, the present invention includes technical features and matters specifying the invention, which will be described below.

An aspect of the present invention may provide a testing circuit provided in a semiconductor integrated circuit so as to detect a delay fault in the semiconductor integrated circuit which includes a first output control circuit including a plurality of sequential circuits, a first combination circuit connected so as to follow the first output control circuit and a memory circuit connected so as to follow the first combination circuit. The testing circuit, under control of a testing apparatus connected to the semiconductor integrated circuit, may input a result of predetermined processing being performed on an output of a first sequential circuit leading to an address terminal of the memory circuit via the first combination circuit from among the plurality of sequential circuits, to the first sequential circuit, store predetermined data in the memory circuit via the first combination circuit in accordance with the result of the predetermined processing being performed, at a predetermined alternation timing of a predetermined clock input to the plurality of sequential circuits and the memory circuit, and read the stored data from the memory circuit as a result of delay fault detection in the semiconductor integrated circuit at a next alternation timing subsequent to the predetermined clock alternating an odd number of times after the predetermined alternation timing.

By way of this, the testing circuit performs predetermined processing of an output of the first sequential circuit leading to the memory circuit in response to the predetermined clock alternating an odd number of times after an alternation timing at which predetermined data was stored in the memory circuit. Subsequently, the testing circuit reads the predetermined data from the memory circuit at an alternation timing after the clock alternating the odd number of times, which makes a logic of the output of the first sequential circuit leading to the memory circuit correspond to a logic when storing the predetermined data in the memory circuit, enabling delay fault detection in a path from the first output control circuit to the memory circuit via the first combination circuit.

It is possible that: the plurality of sequential circuits are connected in series; and before inputting the result of the predetermined processing to the first sequential circuit, the testing circuit inputs a predetermined test pattern to an upstream-most sequential circuit, and transmits the test pattern from the foremost sequential circuit to a downstream-most sequential circuit based on the predetermined clock.

By way of this, before inputting the result of the predetermined processing to the first sequential circuit, the testing circuit can set each of states of the plurality of sequential circuits to a state according to the predetermined test pattern.

Further, it is possible that: before inputting the predetermined test pattern to the upstream-most sequential circuit, the testing circuit sets a frequency of the predetermined clock to a first frequency; and after transmitting the predetermined test pattern from the upstream-most sequential circuit to the downstream-most sequential circuit, sets the frequency of the predetermined clock to a second frequency that is higher than the first frequency.

By way of this, the testing circuit can store predetermined data in the memory circuit according to the predetermined clock having a second frequency, which is higher than the first frequency at the time of inputting the predetermined test pattern, and read the predetermined data from the memory circuit in response to the predetermined clock alternating an odd number of times.

Further, it is possible that: the semiconductor integrated circuit further includes a second combination circuit connected so as to follow the memory circuit and a second output control circuit connected so as to follow the second combination circuit, the second output control circuit including the plurality of sequential circuits; and the testing circuit makes a sequential circuit in the second output control circuit to latch data read from the memory circuit via the second combination circuit based on the predetermined clock, and transmits the data latched by the sequential circuit in the second output control circuit to a downstream-most sequential circuit based on the predetermined clock.

By way of this, the testing circuit can make a sequential circuit in the second output control circuit latch data read from the memory circuit and output the latched data to the outside via the sequential circuit of the second output control circuit.

Further, it is possible that the predetermined processing is logical negation.

Another aspect of the present invention provides a testing method for, under control of a testing apparatus, detecting a delay fault in a semiconductor integrated circuit in which includes a first output control circuit including a plurality of sequential circuits, a first combination circuit connected to follow the first output control circuit, and a memory circuit connected to follow the first combination circuit. The testing method may include: inputting a result of predetermined processing being performed on an output of a first sequential circuit from among the plurality of sequential circuits, to the first sequential circuit; storing predetermined data in the memory circuit via the first combination circuit in accordance with the result of the predetermined processing at a predetermined alternation timing of a predetermined clock input to the plurality of sequential circuits and the memory circuit; reading the stored data from the memory circuit at a next alternation timing subsequent to the predetermined clock alternating an odd number of times after the predetermined alternation timing; and determining whether the data read from the memory circuit is in a first state indicating an expected value and performing delay fault detection based on a result of the determination.

By way of this, the testing apparatus performs predetermined processing of a logic of an output of the first sequential circuit leading to the memory circuit in response to the predetermined clock alternating an odd number of times after an alternation timing at which predetermined data was stored in the memory circuit. Subsequently, the testing apparatus reads the predetermined data, from the memory circuit at an alternation timing after the clock alternating the odd number of times. Thus, the logic of the output of the first sequential circuit leading to the memory circuit correspond to a logic when storing the predetermined data in the memory circuit, and thereby delay fault can be detected in a path from the first output control circuit to the memory circuit via the first combination circuit.

Furthermore, another aspect of the present invention may provide a computer product storing a program for detecting a delay fault in a semiconductor integrated circuit therein. The semiconductor integrated circuit may include a first output control circuit including a plurality of sequential circuits, a first combination circuit connected to follow the first output control circuit, and a memory circuit connected to follow the first combination circuit. The program may include instructions to cause a control device of a testing apparatus to perform to: input a result of predetermined processing of an output of a first sequential circuit from among the plurality of sequential circuits, to the first sequential circuit; store predetermined data in the memory circuit via the first combination circuit in accordance with a result of the predetermined processing at a predetermined alternation timing of a predetermined clock input to the plurality of sequential circuits and the memory circuit; read the stored data from the memory circuit at a next alternation timing subsequent to the predetermined clock alternating an odd number of times after the predetermined alternation timing; and determine whether the data read from the memory circuit is in a first state indicating an expected value and performs delay fault detection based on a result of the determination.

By way of this, the testing apparatus performs predetermined processing of an output of the first sequential circuit leading to the memory circuit in response to the predetermined clock alternating an odd number of times after an alternation timing at which predetermined data was stored in the memory circuit. Subsequently, the testing apparatus reads the predetermined data from the memory circuit at an alternation timing after the clock alternating the odd number of times, which makes a logic of the output of the first sequential circuit leading to the memory circuit correspond to a logic when storing the predetermined data in the memory circuit, enabling delay fault detection in a path from the first output control circuit to the memory circuit via the first combination circuit.

Furthermore, another aspect of the present invention may provide a recording medium with a program for detecting a delay fault in an semiconductor integrated circuit recorded thereon, the semiconductor integrated circuit including a first output control circuit including a plurality of sequential circuits, a first combination circuit connected so as to follow the first output control circuit, and a memory circuit connected so as to follow the first combination circuit, the program making a control device of a testing apparatus execute: a function that inputs a result of predetermined of an output of a first sequential circuit from among the plurality of sequential circuits, to the first sequential circuit; a function that stores predetermined data in the memory circuit via the first combination circuit according to a result of the predetermined processing at a predetermined alternation timing of a predetermined clock input to the plurality of sequential circuits and the memory circuit; a function that reads the stored data from the memory circuit at a next alternation timing subsequent to the predetermined clock alternating an odd number of times after the predetermined alternation timing; and a function that determines whether or not the data read from the memory circuit is in a first state indicating an expected value and performs delay fault detection based on a result of the determination.

By way of this, the testing apparatus performs predetermined processing of an output of the first sequential circuit leading to the memory circuit in response to the predetermined clock alternating an odd number of times after an alternation timing at which predetermined data was stored in the memory circuit. Subsequently, the testing apparatus reads the predetermined data from the memory circuit at an alternation timing after the clock alternating the odd number of times, which makes a logic of the output of the first sequential circuit leading to the memory circuit correspond to a logic when storing the predetermined data in the memory circuit, enabling delay fault detection in a path from the first output control circuit to the memory circuit via the first combination circuit.

The present invention enables a testing circuit to detect a delay fault in a path from a downstream-most combination circuit in a preceding logic circuit to a memory circuit and a path from the memory circuit to a following combination circuit.

Other technical features, objects, operations and effects and advantages of the present invention will be clarified by the following embodiments described with reference to the attached drawings.

DETAILED DESCRIPTION

Embodiments of the present invention will be described with reference to the drawings.

Figure 1:
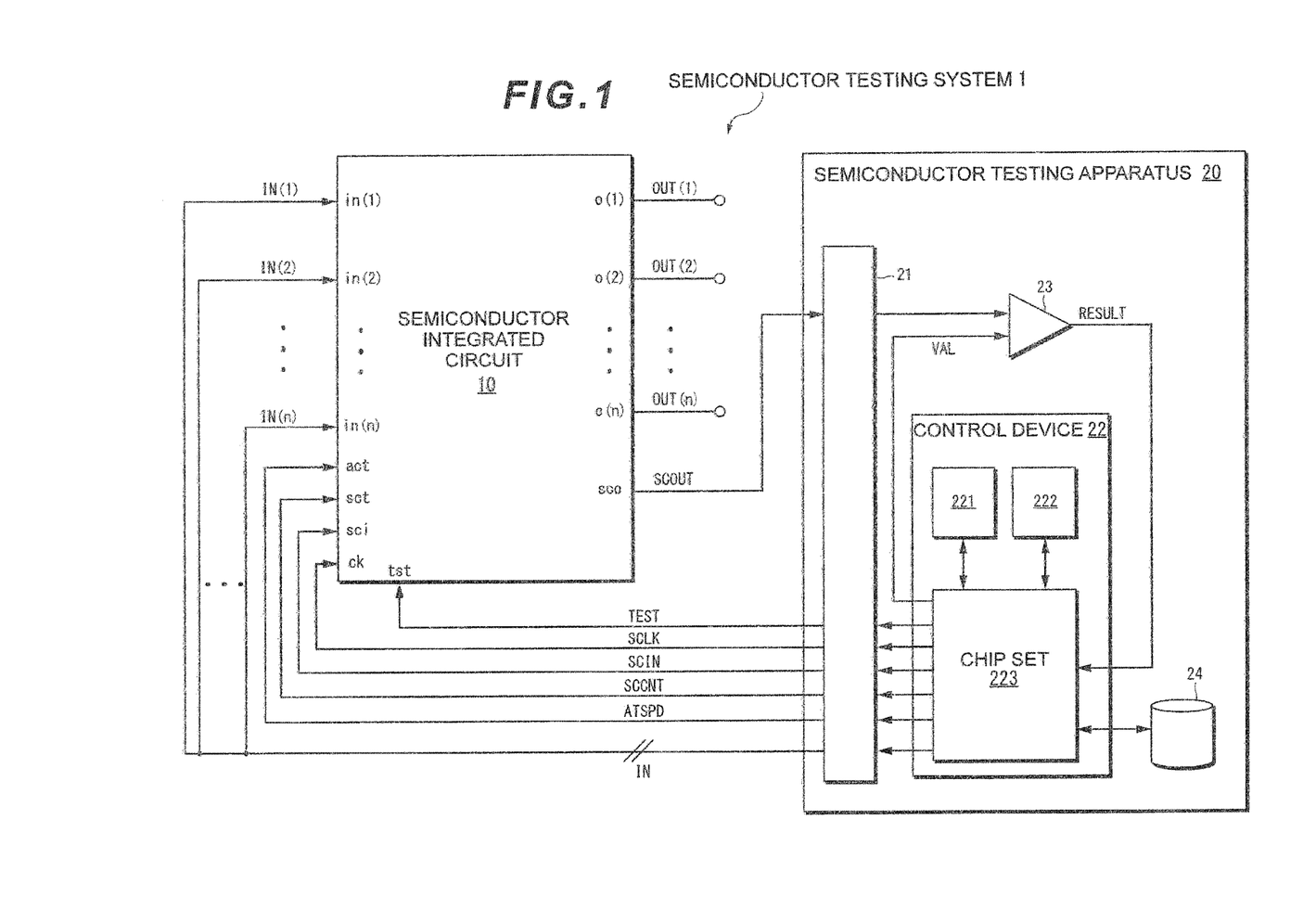
FIG. 1 is a diagram illustrating an example of a schematic configuration of a semiconductor testing system according to an embodiment of the present invention.

FIG. 1 is a diagram illustrating an example of a schematic configuration of a semiconductor testing system according to an embodiment of the present invention. As illustrated in the figure, a semiconductor testing system 1 according to the present embodiment includes, for example, a semiconductor integrated circuit 10 and a semiconductor testing apparatus 20.

The semiconductor integrated circuit 10 under test may be, for example, one of a plurality of chips formed on a wafer (i.e., ASICs: application specific integrated circuits) or a die-cut chip, but is not limited to these examples. The semiconductor integrated circuit 10 may be mounted on, for example, a non-illustrated predetermined mount table, and operate under the control of the semiconductor testing apparatus 20. The semiconductor integrated circuit 10 may perform processing of input signals IN(1) to IN(n) input from the semiconductor testing apparatus 20 based on a system clock SCLK input from the semiconductor testing apparatus 20, and output a result of the processing to the outside in the form of output signals OUT(1) to OUT(n). Further, an operation mode of the semiconductor integrated circuit 10 may be switched to an operation mode in accordance with any of various mode switching signals, which may be input from the semiconductor testing apparatus 20. Examples of the mode switching signals may include a test signal TEST for enabling/disabling a test mode, a scan control signal SCCNT for enabling/disabling a scan mode and an actual operation signal ATSPD for enabling/disabling an actual operation test mode.

If the test mode is enabled by the semiconductor testing apparatus 20, the semiconductor integrated circuit 10 may enable operation of a memory circuit. Here, if the test mode is disabled, enabling of operation of the memory circuit is determined according to the input signals IN(1) to IN(n). Further, if the scan mode is enabled by the semiconductor testing apparatus 20, the semiconductor integrated circuit 10 may establish a scan path from a scan input terminal sci to a scan output terminal sco via a path connecting sequential circuits (e.g., flip-flops) in series. In a case where the scan mode is enabled, the semiconductor integrated circuit 10 may set a state of the sequential circuits to data according to a scan input signal SCIN input to the scan input terminal sci based on the system clock SCLK, and outputs the state of the sequential circuits from the scan output terminal sco to the semiconductor testing apparatus 20 in the form of a scan output signal SCOUT. Also, if the actual operation test mode is enabled by the semiconductor testing apparatus 20, the semiconductor integrated circuit 10 builds an internal circuit so that a delay fault in the memory circuit and combination circuits and sequential circuits connected so as to precede or follow the memory circuit can be detected.

The semiconductor testing apparatus 20 may be, for example, an LSI tester or an evaluation board. The semiconductor testing apparatus 20 controls operation of the semiconductor integrated circuit 10 and conducts a test for detecting a delay fault in the semiconductor integrated circuit 10. The semiconductor testing apparatus 20 may include, for example, an interface device 21, a control device 22, a comparator 23 and a storage device 24.

The interface device 21 may include, for example, a configuration for mounting the semiconductor integrated circuit 10 thereon and electrically connecting the semiconductor integrated circuit 10 to the control device 22. Various signals output from the control device 22 may be output to the semiconductor integrated circuit 10 via the interface device 21, and the scan output signal SCOUT output from the semiconductor integrated circuit 10 may be output to the comparator 23.

The control device 22, which can be configured by a known computing device, may include, for example, a processor module 221, a memory module 222, which may be provided as a primary storage device for the processor module 221, and a chip set 223 that controls transmission/reception of data to/from various components including the processor module 221. Under the control of the processor module 221, the control device 22 may determine operation of the semiconductor integrated circuit 10 and control the operation in accordance with a test program read from the storage device 24. More specifically, the control device 22 may output the system clock SCLK, the input signals IN(1) to IN(n), the test signal TEST, the scan control signal SCCNT, the scan input signal SCIN and the actual operation signal ATSPD to the semiconductor integrated circuit 10 via the interface device 21, and in response to these signals, output an evaluation signal VAL indicating an expected value of a state of the scan output signal SCOUT output from the semiconductor integrated circuit 10, to the comparator 23, and output a test result indicated by a result signal RESULT output from the comparator 23, to the storage device 24.

The comparator 23 may determine whether the state of the scan output signal SCOUT output from the semiconductor integrated circuit 10 via the interface device 21 corresponds to the expected value indicated by the evaluation signal VAL output from the control device 22, for example, in accordance with the evaluation signal VAL output from the control device 22, and output a result of the determination to the control device 22 in the form of the result signal RESULT.

The storage device 24 may store, for example, a test program and test data indicating a content of control in a delay fault test conducted for the semiconductor integrated circuit 10 by the control device 22. Further, the storage device 24 may store, for example, a result of a test for detecting a delay fault in the semiconductor integrated circuit 10, which may be output from the control device 22.

The semiconductor testing system 1 configured as described above may conduct a test for the semiconductor integrated circuit 10 under the control of the semiconductor testing apparatus 20. Specifically, the semiconductor testing system 1 may enable the test mode and the scan mode of the semiconductor integrated circuit 10 and set the sequential circuits in the semiconductor integrated circuit 10 to a predetermined state. Next, the semiconductor testing system 1 may disable the scan mode of the semiconductor integrated circuit 10. The semiconductor testing system 1 may put the semiconductor integrated circuit 10 into actual operation to conduct delay fault detection and then enable the scan mode again. Then, the semiconductor testing system 1 may determine whether the state of the sequential circuits corresponds to an expected value, and store a result of the determination in the storage device 24. By way of this, the semiconductor testing system 1 can conduct a delay fault detection test for the semiconductor integrated circuit 10.

Figure 2:
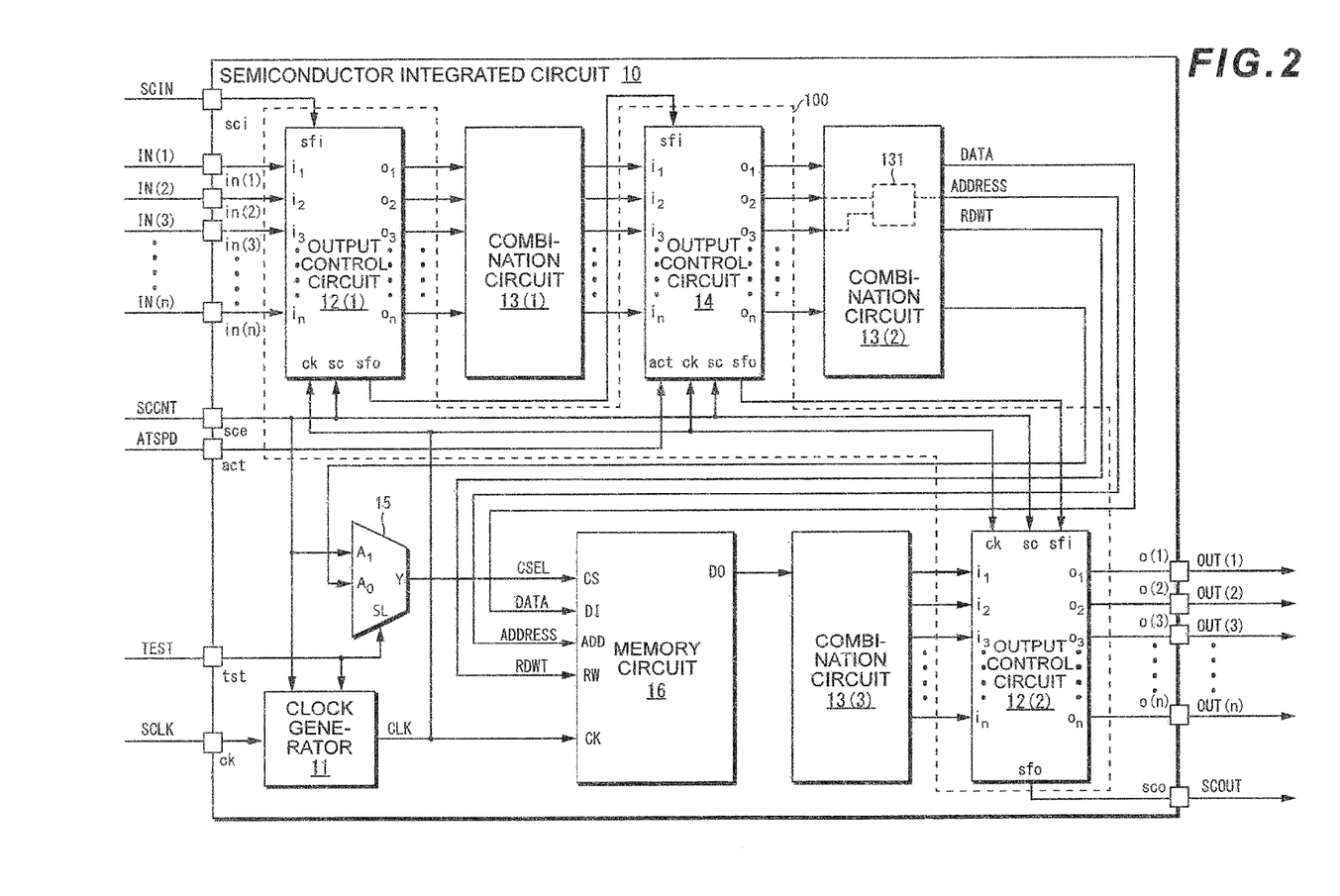
FIG. 2 is a diagram illustrating an example of a configuration of a semiconductor integrated circuit according to an embodiment of the present invention.

FIG. 2 is a diagram illustrating an example of a configuration of a semiconductor integrated circuit according to an embodiment of the present invention. As illustrated in the figure, the semiconductor integrated circuit 10 according to the present embodiment may include a clock generator 11, output control circuits 12(1) and 12(2) and 14, combination circuits 13(1) to 13(3), a selection circuit 15, and a memory circuit 16.

The clock generator 11 may select either the system clock SCLK output from the semiconductor testing apparatus 20 or a clock internally generated based on the system clock SCLK, in accordance with the scan control signal SCCNT output from the semiconductor testing apparatus 20, and output a result of the selection. More specifically, the clock generator 11 may select the system clock SCLK if the scan control signal SCCNT indicates, for example, "asserted," and selects the clock internally generated based on the system clock SCLK if the scan control signal SCCNT indicates, for example, "deasserted," and output a result of the selection to the output control circuits 12(1) and 12(2) and 14 and the memory circuit 16. Further, if the scan control signal SCCNT indicates "deasserted" and the test signal TEST output from the semiconductor testing apparatus 20 indicates "asserted," the clock generator 11 may output a number of pulses of the internally-generated clock, the number corresponding to a predetermined number of alterations, and then stop clock output.

The output control circuits 12 may include a plurality of sequential circuits such as flip-flops. If the scan control signal SCCNT input to scan control terminal sc indicates, for example, "deasserted," the output control circuit 12 may cause the respective sequential circuits to latch respective signals input to input terminals $i_1$ to $i_n$ from a preceding circuit, based on the clock CLK input to the clock terminal ck, and to output the latched signals from respective output terminals $o_1$ to $o_n$ to a following circuit. On the other hand, for example, if the scan control signal SCCNT indicates "asserted," the output control circuit 12 may function as a shift register that outputs a signal input to a shift input terminal sfi, from a shift output terminal sfo via the respective sequential circuits. If the output control circuit 12 functions as a shift register, the output control circuits 12 may output a state of each sequential circuit to a corresponding following sequential circuit based on the clock CLK. The output control circuits 12 may provide a testing circuit 100 jointly with a later-described output control circuit 14.

The combination circuits 13 may include components (e.g., logical gates, switching circuits, resistors and capacitors) other than the sequential circuits. The combination circuits 13 may perform processing based on an input signal, and output a result of the processing to a following circuit. In this example, the combination circuit 13(2) may include a logical circuit 131. The logical circuit 131 may perform processing of an input signal, and output a result of the processing to an address terminal ADD of the memory circuit 16 in the form of an address signal ADDRESS.

The output control circuit 14 may have additional operation relating to the actual operation test mode to an output control circuit 12 as described above. If the actual operation signal ATSPD input to an actual operation terminal act indicates "asserted," the output control circuit 14 may select a result of predetermined processing, for example, logical negation, being performed on outputs of some of the sequential circuits, for input signals for the sequential circuits. On the other hand, if the actual operation signal ATSPD indicates "deasserted," the output control circuit 14 may select signals input from the preceding combination circuit 13(1) for input signals for the sequential circuits.

The selection circuit 15 may be, for example, a multiplexer, but is not limited to this and may be, for example, a data selector or a signal switch. The selection circuit 15 may select either the scan control signal SCCNT or a signal output from the combination circuit 13(2) based on the test signal TEST, and output a result of the selection to the memory circuit 16 in the form of a chip selection signal CSEL. More specifically, if the test signal TEST input to a selection terminal SL indicates, for example, "asserted," the selection circuit 15 may select the scan control signal SCCNT, whereas if the test signal TEST indicates, for example, "deasserted," the selection circuit 15 may select the signal output from the combination circuit 13(2), and output a result of the selection to a chip selection terminal CS of the memory circuit 16 in the form of the chip selection signal CSEL.

The memory circuit 16 may include, for example, a storage element such as an SRAM, a DRAM, a flash memory or a ROM, and perform data storage/reading operation based on an input signal. More specifically, if a read/write signal RDWT input to a read/write terminal RW indicates write processing, the memory circuit 16 may store data indicated by a data signal DATA input to a data input terminal DI in an address indicated by the address signal ADDRESS input to the address terminal ADD. On the other hand, if the read/write signal RDWT indicates read processing, the memory circuit 16 may read data stored in an address indicated by the address signal ADDRESS and outputs the read data from a data output terminal DO to the combination circuit 13(3). Further, if a state of the chip selection signal CSEL is "0," the memory circuit 16 may enable operation in accordance with various signals input to the memory circuit 16 itself, whereas if the state of the chip selection signal CSEL is "1," the memory circuit 16 may disable the operation.

Here, operation of the semiconductor integrated circuit 10 in a case where the scan mode is enabled will be described. If the scan mode is enabled (e.g., the scan control signal SCCNT indicates "1"), the clock generator 11 may select the system clock SCLK output from the semiconductor testing apparatus 20 for a clock CLK and outputs the clock CLK. The output control circuit 12(1), based on the clock CLK, may latch the scan input signal SCIN input to the shift input terminal sfi and output the latched signal from the shift output terminal sfo to the shift input terminal sfi of the output control circuit 14. The output control circuit 14, based on the clock CLK, may latch the signal output from the output control circuit 12(1) and output the latched signal from the shift output terminal sfo to the shift input terminal sfi of the output control circuit 12(2). The output control circuit 12(2), based on the clock CLK, may latch the signal output from the output control circuit 14 and output the latched signal from the shift output terminal sfo to the semiconductor testing apparatus 20 as the scan output signal SCOUT. As described above, if the scan mode is enabled, the semiconductor integrated circuit 10 may set a state of the respective sequential circuits in the output control circuits 12(1) and 12(2) and 14 to a predetermined state according to the scan input signal SCIN, and output the state of the sequential circuits to the semiconductor testing apparatus 20 in the form of the scan output signal SCOUT.

Next, operation of the semiconductor integrated circuit 10 in a case where the scan mode is disabled will be described. It is assumed that the test mode is enabled. If the scan mode is disabled (e.g., the scan control signal SCCNT indicates "0"), the clock generator 11 may internally generate a clock having a frequency that is higher than that of the system clock SCLK, and select and output the generated clock as the clock CLK. The output control circuit 12(1), based on the clock CLK, may latch the input signals IN(1) to IN(n) and outputs the latched signals from the output terminals $o_1$ to $o_n$, respectively, to the combination circuit 13(1). The combination circuit 13(1) may perform processing in accordance with various signals output from the output control circuit 12(1), and output a result of the processing to the input terminals $i_1$ to $i_n$ of the output control circuit 14.

The output control circuit 14 may latch various signals output from the combination circuit 13(1) and output the latched signals from the respective output terminals $o_1$ to $o_n$ to the combination circuit 13(2). If the actual operation test mode is enabled, with respect to the sequential circuit associated with an output leading to the address terminal ADD of the memory circuit 16 via the logical circuit 131 in the combination circuit 13(2), the output control circuit 14 may select not a signal output from the combination circuit 13(1) but, as an input signal to the relevant sequential circuit, a result of logical negation of an output signal of the relevant sequential circuit, and output the result of the selection to the logical circuit 131. The combination circuit 13(2) may perform processing in accordance with various signals output from the output control circuit 14, and provide results of the processing in the form of the data signal DATA, the address signal ADDRESS, the read/write signal RDWT and another signal and output the data signal DATA, the address signal ADDRESS and the read/write signal RDWT to the memory circuit 16, and output the other signal to the selection circuit 15. The selection circuit 15 may output the scan control signal SCCNT as the chip selection signal CSEL to the memory circuit 16 in accordance with the test signal TEST.

Since the chip selection signal CSEL is "0," the memory circuit 16 may enable operation thereof. The memory circuit 16, based on the predetermined clock CLK, may store data in accordance with the data signal DATA in an address in accordance with the address signal ADDRESS, and read data stored at an address in accordance with the address signal ADDRESS and output the read data from the data output terminal DO to the combination circuit 13(3). The combination circuit 13(3) may perform processing in accordance with the signal output from the memory circuit 16 and output a result of the processing to the output control circuit 12(2). The output control circuit 12(2) may latch the signals output from the combination circuit 13(3) and output results of the latching from the output terminals $o_1$ to $o_n$ to the outside in the form of the output signals OUT(1) to OUT(n). As described above, if the scan mode is disabled, the semiconductor integrated circuit 10 may perform processing in accordance with the input signals IN(1) to IN(n) and output a result of processing to the outside in the form of the output signals OUT(1) to OUT(n).

Figure 3:
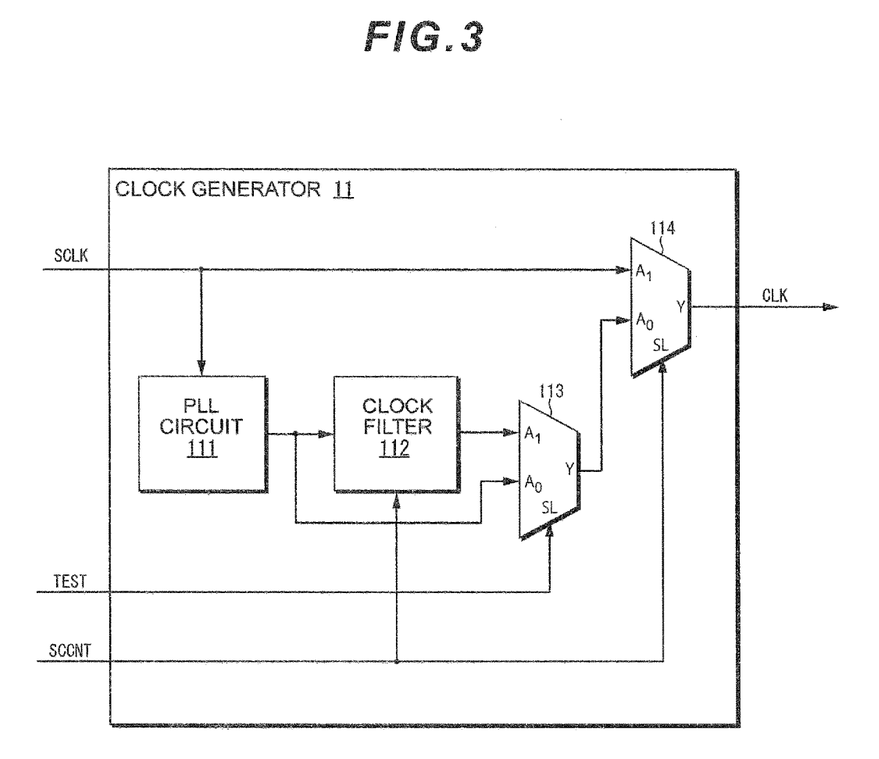
FIG. 3 is a diagram illustrating an example of a configuration of a clock generator in a semiconductor integrated circuit according to an embodiment of the present invention.

FIG. 3 is a diagram illustrating an example of a configuration of a clock generator in a semiconductor integrated circuit according to an embodiment of the present invention. As illustrated in the figure, the clock generator 11 may include a PLL circuit 111, a clock filter 112, and selection circuits 113 and 114.

The PLL circuit 111 may generate, based on the system clock SCLK, a clock having a frequency that is higher than the frequency of the clock. The PLL circuit 11 may output the generated clock to the clock filter 112 and an input terminal $A_0$ of the selection circuit 113.

The clock filter 112 may output a number of pulses of the clock output from the PLL circuit 111, the number corresponding to a predetermined number of alterations, to an input terminal $A_1$ of the selection circuit 113 based on the control signal SCCNT. More specifically, the clock filter 112 may check a state of the scan control signal SCCNT output from the semiconductor testing apparatus 20, and if the state of the signal is switched from "deasserted" to "asserted," output a number of pulses of the clock output from the PLL circuit 111, the number corresponding to a predetermined number of alternations, to the input terminal $A_1$ of the selection circuit 113.

Each of the selection circuits 113 and 114 may be, for example, a multiplexer, but is not limited to this and may be, for example, a data selector or a signal switch. The selection circuits 113 and 114 may select either of signals input to the input terminals $A_0$ and $A_1$ based on the signal input to the selection terminal SL, and output a result of the selection. More specifically, if the test signal TEST indicates "asserted," the selection circuit 113 may select the clock output from the clock filter, whereas if the test signal TEST indicates "deasserted," the selection circuit 113 may select the clock output from the PLL circuit 111, and output a result of the selection to an input terminal $A_0$ of the selection circuit 114. Further, if the scan control signal SCCNT indicates "asserted," the selection circuit 114 may select the system clock SCLK, whereas if the scan control signal SCCNT indicates "deasserted," the selection circuit 114 may select the clock output from the selection circuit 113, and output, as the clock CLK, a result of the selection to the output control circuits 12(1) and 12(2) and 14 and the memory circuit 16.

Figure 4:
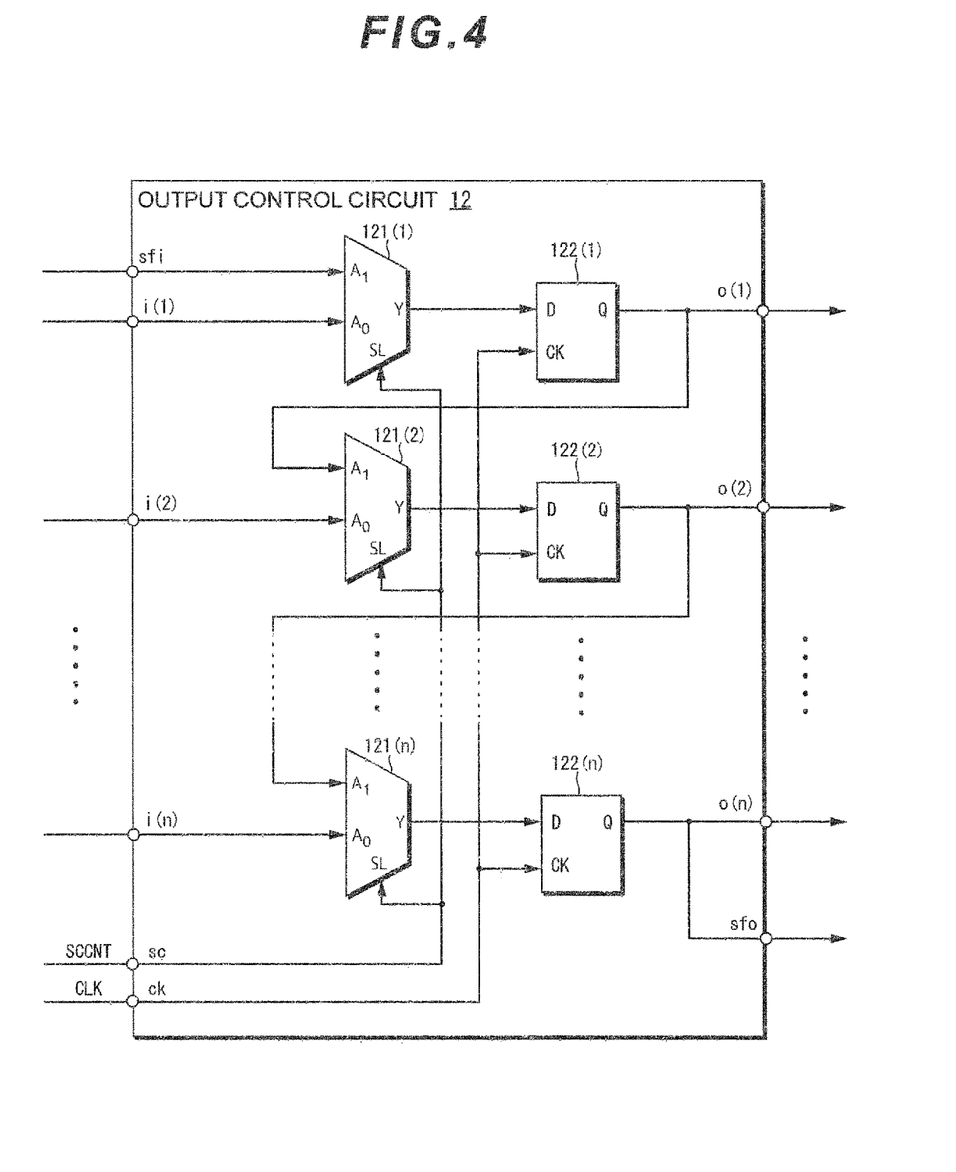
FIG. 4 is a diagram illustrating an example of a configuration of an output control circuit in a semiconductor integrated circuit according to an embodiment of the present invention.

FIG. 4 is a diagram illustrating an example of a configuration of an output control circuit in a semiconductor integrated circuit according to an embodiment of the present invention. As illustrated in the figure, each of the output control circuits 12 in accordance with the present embodiment may include selection circuits 121(1) to 121(n) and sequential circuits 122(1) to 122(n). The selection circuits 121 and the sequential circuits 122 may be associated one by one with each other, and the plurality of sets of a selection circuit 121 and a sequential circuit 122 may be connected in series.

A circuit configuration of each of the selection circuits 121 may typically be the same as those of the selection circuits 15, 113 and 114 described above. The selection circuit 121 may select a select signal input to an input terminal $A_1$ from a preceding sequential circuit 122 or a shift input terminal sfi if the scan control signal SCCNT indicates "asserted," and select a signal input from an input terminal i to an input terminal $A_0$ if the scan control signal SCCNT indicates "deasserted," and output the selected signal to a data input terminal D of the corresponding sequential circuit 122.

The sequential circuits 122 may be, for example, flip-flops. The sequential circuit 122, based on the clock CLK input to a clock terminal ck, may latch a signal output from the corresponding selection circuit 121 and output the latched signal from a data output terminal Q to a corresponding output terminal o and an input terminal $A_1$ of the following selection circuit 121. Further, the downstream-most sequential circuit 122(n) may output the latched signal to an output terminal o(n) and a shift output terminal sfo.

Figure 5:
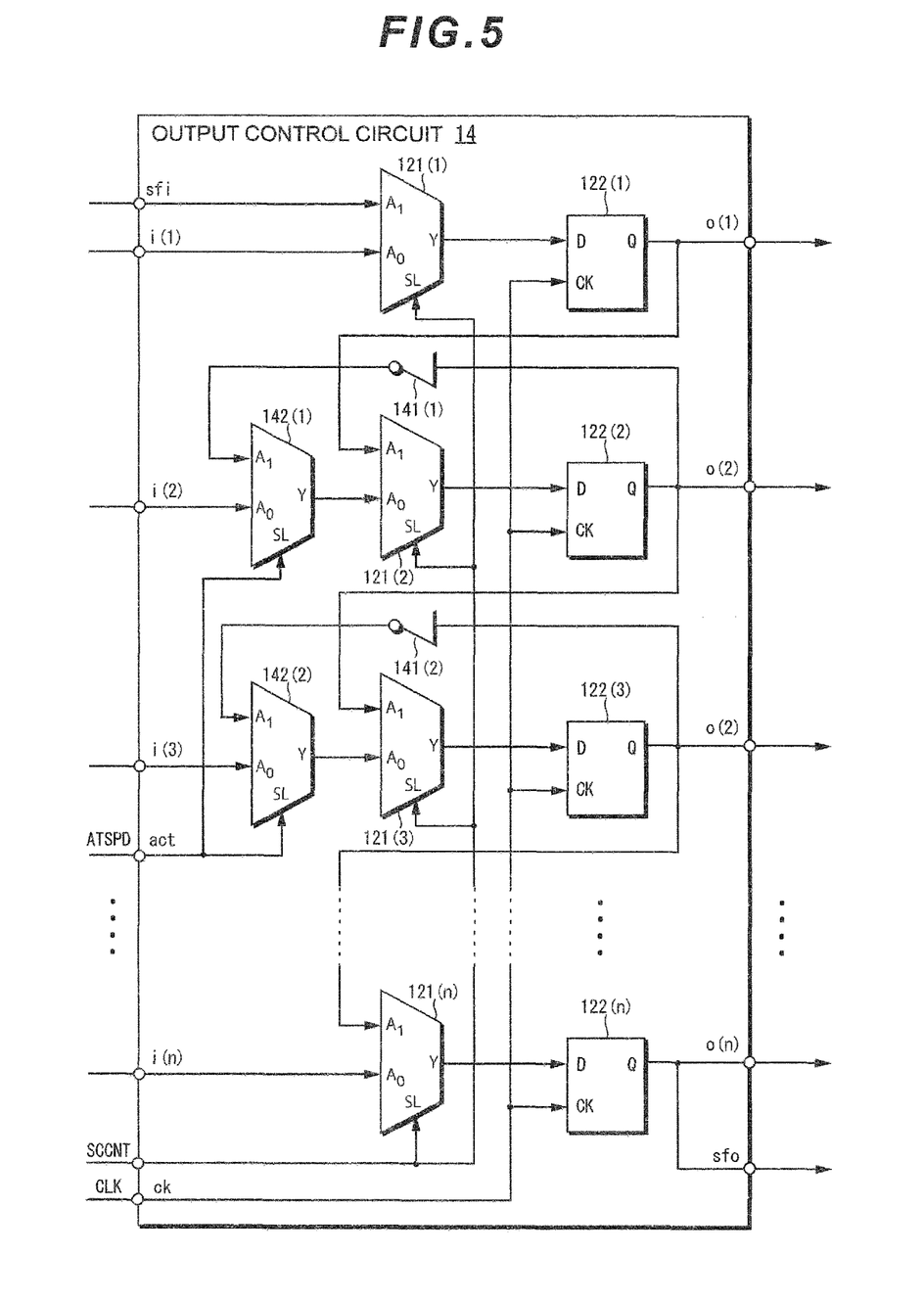
FIG. 5 is a diagram illustrating an example of a configuration of an output control circuit in a semiconductor integrated circuit according to an embodiment of the present invention.

FIG. 5 is a diagram illustrating an example of a configuration of an output control circuit in a semiconductor integrated circuit according to an embodiment of the present invention. As illustrated in the figure, the output control circuit 14 according to the present embodiment may be configured by adding logical NOT circuits 141 and selection circuits 142 to the output control circuit 12. A logical NOT circuit 141 and a selection circuit 142 may be provided for each of sets of a selection circuit 121 and a sequential circuit 122 that output a signal to be transmitted to the address terminal ADD of the memory circuit 16 (see FIG. 2). In this example, a logical NOT circuit 141 and a selection circuit 142 may be provided for each of sets of a selection circuit 121 and a sequential circuit 122 that output a signal to be transmitted to the address terminal ADD of the memory circuit 16, but the present invention is not limited to this case. A logical NOT circuit 141 and a selection circuit 142 may be provided for each of sets of a selection circuit 121 and a sequential circuit 122 that output a signal to be transmitted to an arbitrary input terminal of the memory circuit 16. Further, the selection circuits 121 and the sequential circuits 122 may be the same as those of the output control circuit 12, and thus, description thereof will be omitted.

Each of the logical NOT circuits 141 may be, for example, an inverter circuit. The logical NOT circuit 141 may perform logical negation of a signal output from the corresponding sequential circuit 122, and output a result of the logical negation to an input terminal $A_1$ of the corresponding selection circuit 142.

A circuit configuration of each selection circuit 142 may typically be the same as those of the selection circuits 15, 113, 114 and 121 described above. If the actual operation signal ATSPD output from the semiconductor testing apparatus 20 indicates "asserted," the selection circuit 142 may select an output from the corresponding logical NOT circuit 141, whereas if the actual operation signal ATSPD indicates "deasserted," the selection circuit 142 may select a signal input from the corresponding input terminal i and output a result of the selection to the corresponding selection circuit 121.

The output control circuit 14 configured as described above may select, as an input signal for each of the sequential circuits 122 that output a signal to be transmitted to the address terminal ADD of the memory circuit 16, a result of logical negation of the signal output by the sequential circuit 122 if the actual operation test mode is enabled. On the other hand, the output control circuit 14 may select, as an input signal for each of the sequential circuits 122 that output a signal to be transmitted to the address terminal ADD of the memory circuit 16, a signal input from the preceding combination circuit 13(1) via the corresponding input terminal i if the actual operation test mode is disabled. Then, the output control circuit 14 may output the selected signals to the address terminal ADD of the memory circuit 16 via the following combination circuit 13(2).

In this example, the output control circuit 14 may output a result of logical negation of an output of the sequential circuit 122 by the corresponding logical NOT circuit 141 to the corresponding selection circuit 142, but the present invention is not limited to this case. The output control circuit 14 may store, for example, an output of the sequential circuit 122 using a register (not illustrated), and output the stored output and an output that is different from the stored output alternately to the corresponding selection circuit 142.

Figure 6:
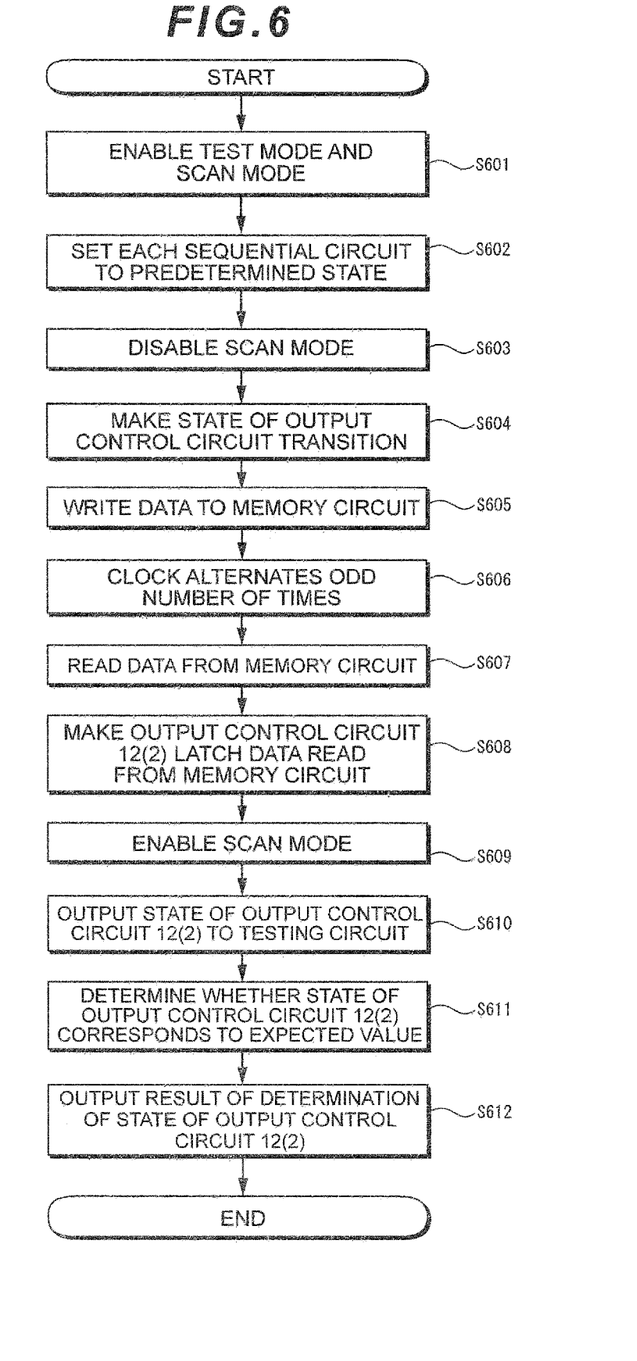
FIG. 6 is a flowchart illustrating an operation of a semiconductor testing apparatus according to an embodiment of the present invention to conduct a step for detecting a delay fault in a semiconductor integrated circuit.

FIG. 6 is a flowchart illustrating an operation of a testing apparatus according an embodiment of the present invention to conduct a step for detecting a delay fault in a semiconductor integrated circuit. As illustrated in the figure, first, the semiconductor testing apparatus 20 may set a state of the test signal TEST to "asserted," and set a state of the scan control signal SCCNT to "asserted" to output these two signals to the semiconductor integrated circuit 10, and thereby the test mode and the scan mode of the semiconductor integrated circuit 10 may be enabled (S601).

Subsequently, the semiconductor testing apparatus 20 may read a predetermined test pattern from the storage device 24, output the read predetermined test pattern as a scan input signal SCIN to the semiconductor integrated circuit 10, and set a state of the sequential circuit inside the semiconductor integrated circuit 10 to a predetermined state according to the scan input signal SCIN (S602). It is noted that the state of the sequential circuits of the output control circuit 12(1) may be determined to a predetermined state that causes transition of a state of the sequential circuit in the output control circuit 14 when the state is transmitted to the output control circuit 14 via the combination circuit 13(1). Next, the semiconductor testing apparatus 20 may set a state of the scan control signal SCCNT to "deasserted," and output the signal to the semiconductor integrated circuit 10, thereby disabling the scan mode of the semiconductor integrated circuit 10 (S603).

The semiconductor testing apparatus 20 may transmit the state of the output control circuit 12(1) to the output control circuit 14 via the combination circuit 13(1) at a timing of the clock CLK in the semiconductor integrated circuit 10 alternating once, thereby causing the state of the output control circuit 14 to transition (S604).

The semiconductor testing apparatus 20 may transmit the state of the output control circuit 14 to the memory circuit 16 via the combination circuit 13(2) at a timing of the clock CLK in the semiconductor integrated circuit 10 alternating once more, and store data in accordance with the state of the output control circuit 14 in an address in the memory circuit 16 indicated by the state of the output control circuit 14 (S605). Subsequently, the semiconductor testing apparatus 20 may cause a state of the address signal ADDRESS in the semiconductor integrated circuit 10 to transition at a timing of the clock CLK in the semiconductor integrated circuit 10 alternating an odd number of times (S606).

Subsequently, the semiconductor testing apparatus 20 may cause the state of the address signal ADDRESS in the semiconductor integrated circuit 10 to transition at a timing of the clock CLK in the semiconductor integrated circuit 10 alternating once to return the state of the address signal ADDRESS to the state in the processing in step S605, and read the data stored at the address in the memory circuit 16 in accordance with the state of the address signal ADDRESS (i.e., the address where data was stored in the processing in step S605) (S607). Subsequently, the semiconductor testing apparatus 20 may transmit, based on the clock CLK in the semiconductor integrated circuit 10, the data read from the memory circuit 16 to the output control circuit 12(2) via the combination circuit 13(3), and cause the output control circuit 12(2) to latch the read data (S608).

Next, the semiconductor testing apparatus 20 may set the state of the scan control signal SCCNT to "asserted," and output the two signals to the semiconductor integrated circuit 10, thereby enabling the scan mode of the semiconductor integrated circuit 10 (S609). Subsequently, the semiconductor testing apparatus 20 may cause a state of the output control circuit 12(2) of the semiconductor integrated circuit 10 to be output as the scan output signal SCOUT to the semiconductor testing apparatus 20 (S610).

Upon receipt of the scan output signal SCOUT, the semiconductor testing apparatus 20 may determine whether or not a state of the scan output signal SCOUT corresponds to a predetermined expected value, thereby determining the state of the output control circuit 12(2) (S611). The semiconductor testing apparatus 20 may output a result of the determination of the state of the output control circuit 12(2) as a result of a test for detecting a delay fault in the semiconductor integrated circuit 10 to the storage device 24 (S612) and terminate the test for detecting a delay fault in the semiconductor integrated circuit 10 after storing of the state by the storage device 24.

As described above, the semiconductor testing apparatus 20 may write data to the memory circuit 16 of the semiconductor integrated circuit 10 and then invert a state (i.e., a logic) of the address signal ADDRESS, and invert a state of the address signal ADDRESS, and read data from the memory circuit 16. By way of this, in operation of writing and reading data to and from the memory circuit 16, the semiconductor testing apparatus 20 may allow respective address designations for the memory circuit 16 to correspond to each other, enabling delay fault detection in a path from the output control circuit 14 to the output control circuit 12(2) via the combination circuit 13(2), the memory circuit 16 and the combination circuit 13(3).

In addition, in this example, in a delay fault detection test for the semiconductor integrated circuit 10, during writing and reading to and from the memory circuit 16, the semiconductor testing apparatus 20 may set the actual operation test mode of the semiconductor integrated circuit 10 to be enabled, thereby performing delay fault detection for components in the output control circuit 14 onwards, but the present invention is not limited to this. The semiconductor testing apparatus 20 may also perform conventional delay fault detection in a path from the output control circuit 12(1) to the output control circuit 14 via the combination circuit 13(1) by setting the actual operation test mode of the semiconductor integrated circuit 10 to be disabled and conducting a conventional scan test.

Figure 7:
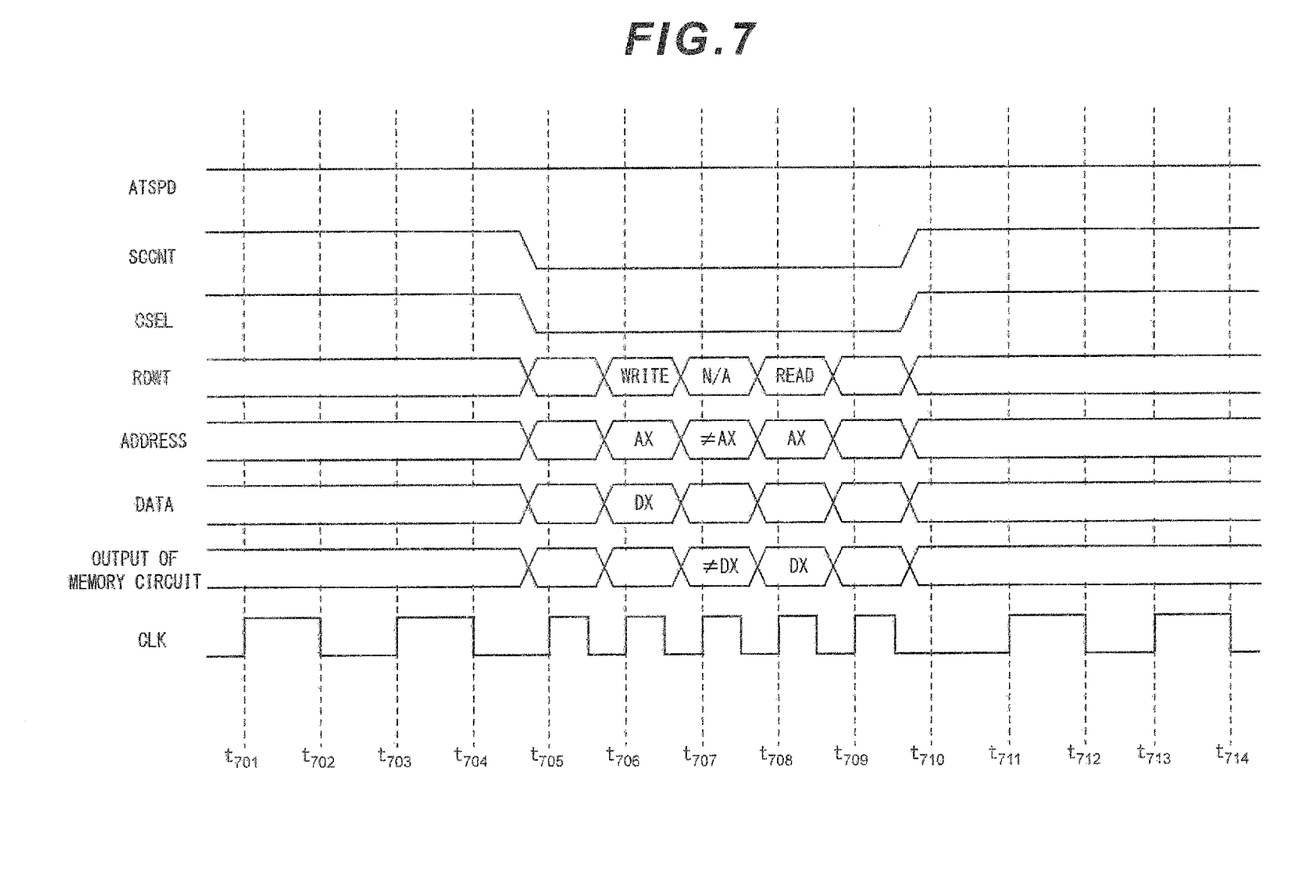
FIG. 7 is a timing chart illustrating transition of various signals in a semiconductor integrated circuit according to an embodiment of the present invention.

FIG. 7 is a timing chart illustrating transition of various signals in a semiconductor integrated circuit according to an embodiment of the present invention. In the figure, it is assumed that times at which the state of the system clock SCLK transitions are times $t_{701}$ to $t_{714}$. It is also assumed that the test mode is enabled.

During times $t_{701}$ to $t_{704}$, the semiconductor testing apparatus 20 may set the state of the scan control signal SCCNT to "1" (i.e., "asserted") and the state of the actual operation signal ATSPD to "1" (i.e., "asserted") and output the two signals to the semiconductor integrated circuit 10. Thus, during times $t_{701}$ to $t_{704}$, the semiconductor integrated circuit 10 may enable the scan mode, and set the state of the chip selection signal CSEL to "1" to disable operation of the memory circuit 16, and enable the actual operation test mode. The clock generator 11 in the semiconductor integrated circuit 10 may output the system clock SCLK as the clock CLK. Further, the semiconductor integrated circuit 10 may set the state of the respective sequential circuits to a predetermined state based on the clock CLK.

At a time $t_{705}$, the semiconductor testing apparatus 20 may set the state of the scan control signal SCCNT to "0" (i.e., "deasserted"). Thus, the semiconductor integrated circuit 10 may disable the scan mode, and set the state of the chip selection signal CSEL to "0" to enable operation of the memory circuit 16. The clock generator 11 in the semiconductor integrated circuit 10 may output a clock generated in the PLL circuit 111 and output via the clock filter 112, as the clock CLK. Further, the semiconductor testing apparatus 20 may cause the state of the output control circuit 14 in the semiconductor integrated circuit 10 to transition at a timing of the clock CLK in the semiconductor integrated circuit 10 alternating once.

At a time $t_{706}$, the memory circuit 16 may store data DX indicated by a data signal DATA in an address AX in the memory circuit 16 indicated by the address signal ADDRESS, in accordance with the read/write signal RDWT output from the combination circuit 13(2).

At a time $t_{707}$, the semiconductor testing apparatus 20 may invert a state of the address signal ADDRESS in the semiconductor integrated circuit 10, thereby causing the state of the signal transition from AX to ≠AX. At time $t_{708}$, the semiconductor testing apparatus 20 may invert the state of the address signal ADDRESS in the semiconductor integrated circuit 10, thereby causing the state of the signal from ≠AX to AX, and read, from the address AX in the memory circuit 16 indicated by the address signal ADDRESS, the data DX stored at the address, in accordance with the read/write signal RDWT, and output the read data to the combination circuit 13(3). At a time $t_{709}$, the semiconductor testing apparatus 20 may cause the output control circuit 12(2) to latch the data DX via the combination circuit 13(3).

At a time $t_{710}$, the semiconductor testing apparatus 20 may set the state of the scan control signal SCCNT to "1." Thus, the semiconductor integrated circuit 10 may enables the scan mode, and cause the state of the chip selection signal CSEL transition to "1," thereby disabling operation of the memory circuit 16. Accordingly, at or after a time $t_{710}$, the semiconductor integrated circuit 10 may output the state of the output control circuit 12(2) to the outside based on the clock CLK.

As described above, under the control of the semiconductor testing apparatus 20, after writing data to the memory circuit 16, the semiconductor integrated circuit 10 may invert a state (i.e., a logic) of the address signal ADDRESS, and then invert the state of the address signal ADDRESS and read the data from the memory circuit 16. By way of this, in operations of writing and reading data to and from the memory circuit 16, the semiconductor testing apparatus 20 may allow can make respective address designations for the memory circuit 16 to correspond to each other, enabling delay fault detection in the path from the output control circuit 14 to the output control circuit 12(2) via the combination circuit 13(2), the memory circuit 16 and the combination circuit 13(3).

The above-described embodiments are mere examples for describing the present invention, and are not intended to limit the present invention only to these examples. The present invention can be carried out in any of various modes as long as such mode departs from the spirit of the present invention.

For example, in the method disclosed in the present specification, the steps, the operations or the functions may be performed in parallel or in an order that is different from the order described above as long as there is no contradiction in the result of the performance. The described steps, operations and functions are provided as mere examples, and some of the steps, operations and functions may be omitted without departing the spirit of the invention and may be united into one component, and other steps, operations and functions may be added.

Also, although the present specification discloses various embodiments, a particular feature (technical matter) of one embodiment can arbitrarily be improved and added to another embodiment or replaced with a particular feature in the other embodiment, and such modes also fall within the spirit of the present invention.

The present invention can widely be used in the field of semiconductor integrated circuits.

What is claimed is:

1. A testing circuit arranged in a semiconductor integrated circuit for detecting a delay fault in the semiconductor integrated circuit, wherein the semiconductor integrated circuit includes a first combination circuit and a memory circuit connected to the first combination circuit, the testing circuit comprising:
at least one output control circuit connected to the first combination circuit,
wherein the at least one output control circuit including:
a plurality of sequential circuits; and
a plurality of feedback paths corresponding to the plurality of sequential circuits, wherein an input terminal of each of the plurality of feedback paths is connected to an output terminal of each corresponding sequential circuit and an output terminal of each of the plurality of feedback paths is connected to an input terminal of the corresponding sequential circuit, wherein each of the plurality of feedback paths includes a circuit to perform predetermined processing on input and outputs a result, wherein the testing circuit is configured to, under control of a testing apparatus connected to the semiconductor integrated circuit, input a result of the predetermined processing being performed on an output of the corresponding sequential circuit to the input terminal of the corresponding sequential circuit, the output of the corresponding sequential circuit travelling to a corresponding address terminal of the memory circuit via the first combination circuit.

2. The testing circuit according to claim 1,
wherein the plurality of sequential circuits are connected in series, and
wherein before inputting the result of the predetermined processing to the corresponding sequential circuit, the testing circuit inputs a predetermined test pattern to an upstream-most sequential circuit, and transmits the test pattern from the upstream-most sequential circuit to a downstream-most sequential circuit based on a predetermined clock.

3. The testing circuit according to claim 2,
wherein before inputting the predetermined test pattern to the upstream-most sequential circuit, a frequency of the predetermined clock is set to a first frequency, and
wherein after transmitting the predetermined test pattern from the upstream-most sequential circuit to the downstream-most sequential circuit, the frequency of the predetermined clock is set to a second frequency that is higher than the first frequency.

4. The testing circuit according to claim 3, wherein the plurality of feedback paths are logical negation circuits.

5. A testing method for detecting, under control of a testing apparatus, a delay fault in a semiconductor integrated circuit, wherein the semiconductor integrated circuit includes a first combination circuit and a memory circuit connected to the first combination circuit, the testing apparatus comprising:
at least one output control circuit connected to the first combination circuit,
wherein the at least one output control circuit including:
a plurality of sequential circuits; and
a plurality of feedback paths corresponding to the plurality of sequential circuits, wherein an input terminal of each of the plurality of feedback paths is connected to an output terminal of each corresponding sequential circuit and an output terminal of each of the plurality of feedback paths is connected to an input terminal of the corresponding sequential circuit, wherein each of the plurality of feedback paths includes a circuit to perform predetermined processing on input and outputs a result, wherein, when the testing apparatus is connected to the semiconductor integrated circuit, the testing method comprising:

inputting a result of the predetermined processing being performed on an output of the corresponding sequential circuit to the input terminal of the corresponding sequential circuit, the output of the corresponding sequential circuit travelling to a corresponding address terminal of the memory circuit via the first combination circuit.

6. The testing method according to claim 5, wherein the plurality of sequential circuits are connected in series, the method further comprising:

before inputting the result of the predetermined processing to the corresponding sequential circuit, inputting a predetermined test pattern to an upstream-most sequential circuit, and transmits the test pattern from the upstream-most sequential circuit to a downstream-most sequential circuit based on a predetermined clock.

7. The testing method according to claim 6, further comprising:

before inputting the predetermined test pattern to the upstream-most sequential circuit, setting a frequency of the predetermined clock to a first frequency, and after transmitting the predetermined test pattern from the upstream-most sequential circuit to the downstream-most sequential circuit, setting the frequency of the predetermined clock to a second frequency that is higher than the first frequency.

8. The testing method according to claim 7, wherein the plurality of feedback paths are logical negation circuits.

9. A computer program product comprising a non-transitory computer readable program media and a program stored on the non-transitory computer readable program media for detecting, under control of a testing apparatus, a delay fault in a semiconductor integrated circuit, wherein the semiconductor integrated circuit includes a first combination circuit and a memory circuit connected to the first combination circuit, the testing apparatus comprising:

at least one output control circuit connected to the first combination circuit, wherein the at least one output control circuit including:

a plurality of sequential circuits; and a plurality of feedback paths corresponding to the plurality of sequential circuits, wherein an input terminal of each of the plurality of feedback paths is connected to an output terminal of each corresponding sequential circuit and an output terminal of each of the plurality of feedback paths is connected to an input terminal of the corresponding sequential circuit, wherein each of the plurality of feedback paths includes a circuit to perform predetermined processing on input and outputs a result, wherein the program includes instructions to cause a control device of the testing apparatus, when the testing apparatus is connected to the semiconductor integrated circuit, to perform:

inputting a result of the predetermined processing being performed on an output of the corresponding sequential circuit to the input terminal of the corresponding sequential circuit, the output of the corresponding sequential circuit travelling to a corresponding address terminal of the memory circuit via the first combination circuit.

10. The computer program product according to claim 9, wherein the plurality of sequential circuits are connected in series, wherein the program further includes instructions to cause the control device of the testing apparatus, when the testing apparatus is connected to the semiconductor integrated circuit, to perform:

before inputting the result of the predetermined processing to the corresponding sequential circuit, inputting a predetermined test pattern to an upstream-most sequential circuit, and transmits the test pattern from the upstream-most sequential circuit to a downstream-most sequential circuit based on a predetermined clock.

11. The computer program product according to claim 10, wherein the program further includes instructions to cause the control device of the testing apparatus, when the testing apparatus is connected to the semiconductor integrated circuit, to perform:

before inputting the predetermined test pattern to the upstream-most sequential circuit, setting a frequency of the predetermined clock to a first frequency, and after transmitting the predetermined test pattern from the upstream-most sequential circuit to the downstream-most sequential circuit, setting the frequency of the predetermined clock to a second frequency that is higher than the first frequency.

12. The computer program product according to claim 11, wherein the plurality of feedback paths are logical negation circuits.

* * * * *